United States Patent [19]
Yamate

[11] Patent Number: 5,245,593
[45] Date of Patent: Sep. 14, 1993

[54] CLOCK PRODUCING APPARATUS FOR A PWM SYSTEM DIGITAL TO ANALOG CONVERTER

[75] Inventor: Kazunori Yamate, Ibaraki, Japan

[73] Assignee: Matsushita Electric Industrial Co., Ltd., Osaka, Japan

[21] Appl. No.: 638,534

[22] Filed: Jan. 8, 1991

[30] Foreign Application Priority Data

Jan. 8, 1990 [JP] Japan .................................. 2-1341

[51] Int. Cl.[5] .......................... G04F 5/00; G10H 1/00
[52] U.S. Cl. ...................................... 368/156; 84/603; 331/51; 331/60; 341/144
[58] Field of Search ................... 368/155–156, 368/200–202; 84/603, 605, 648, 655, 675; 331/50, 51, 60; 341/110, 144–145; 375/22

[56] References Cited

U.S. PATENT DOCUMENTS

| | | | |
|---|---|---|---|
| 3,927,269 | 12/1975 | Yoshino et al. | 179/15 BS |
| 4,024,786 | 5/1977 | Machamian | 84/1.01 |
| 4,611,225 | 9/1986 | Powers | 358/140 |
| 4,701,956 | 10/1987 | Katoh | 381/61 |
| 4,780,772 | 10/1988 | Shibuya et al. | 360/51 |
| 4,970,588 | 11/1990 | Kobayashi | 358/108 |
| 5,101,369 | 3/1992 | Torii et al. | 364/724.11 |

*Primary Examiner*—Vit W. Miska
*Attorney, Agent, or Firm*—Wenderoth, Lind & Ponack

[57] ABSTRACT

A clock producing apparatus for a D/A converter switches the clocks in accordance with the inputted sampling frequencies. A deterioration in the S/N caused by unnecessary spectra which are caused by the inputting of different sampling frequencies is prevented.

The selecting operation is effected by the selecting circuit so as to obtain the selected input sampling frequencies, and at the same time, the clock signals are prevented from being inputted to the frequency dividing circuits corresponding to the input sampling frequencies which are not selected. Therefore, unnecessary spectra are prevented from being generated.

2 Claims, 5 Drawing Sheets

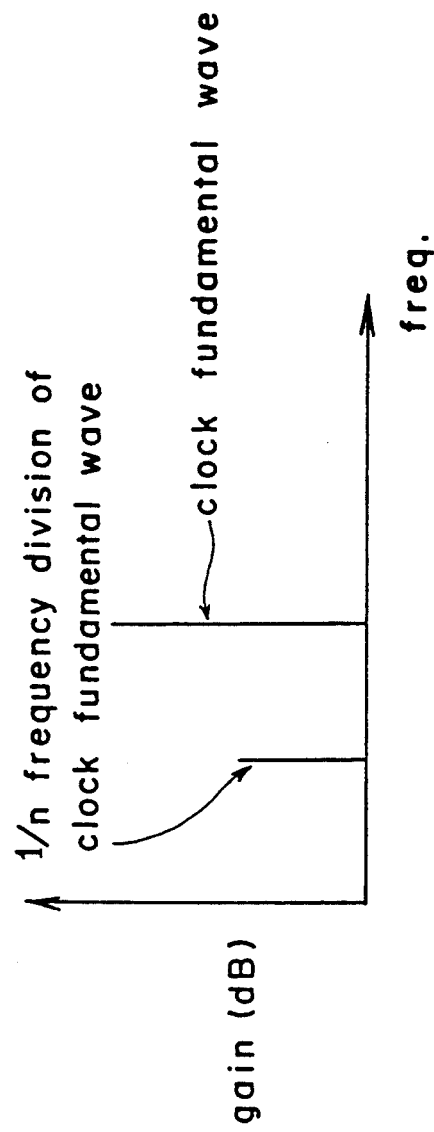
Fig. 3
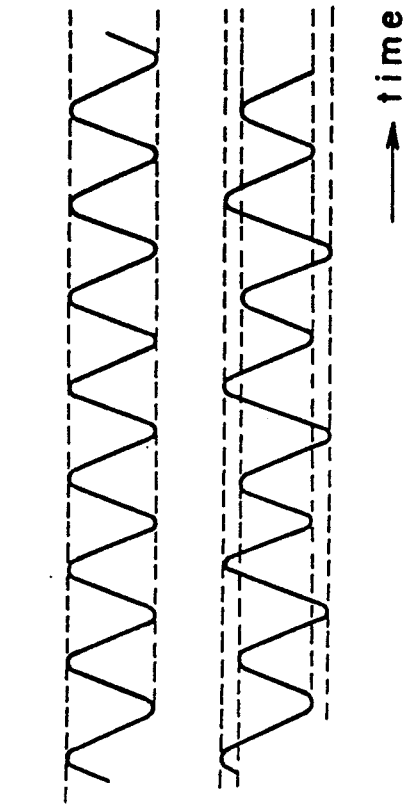
Fig. 4(a)
clock fundamental wave
Fig. 4(b)
1/2 freq. division of clock fundamental wave

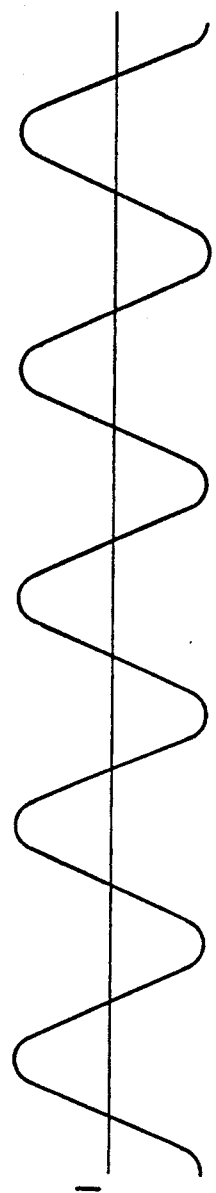
Fig. 5(a)
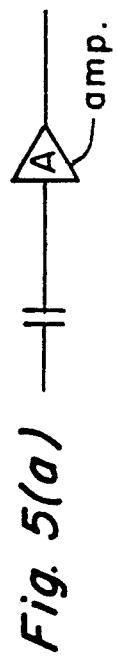
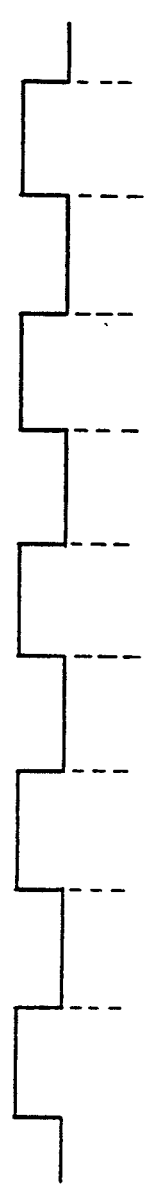
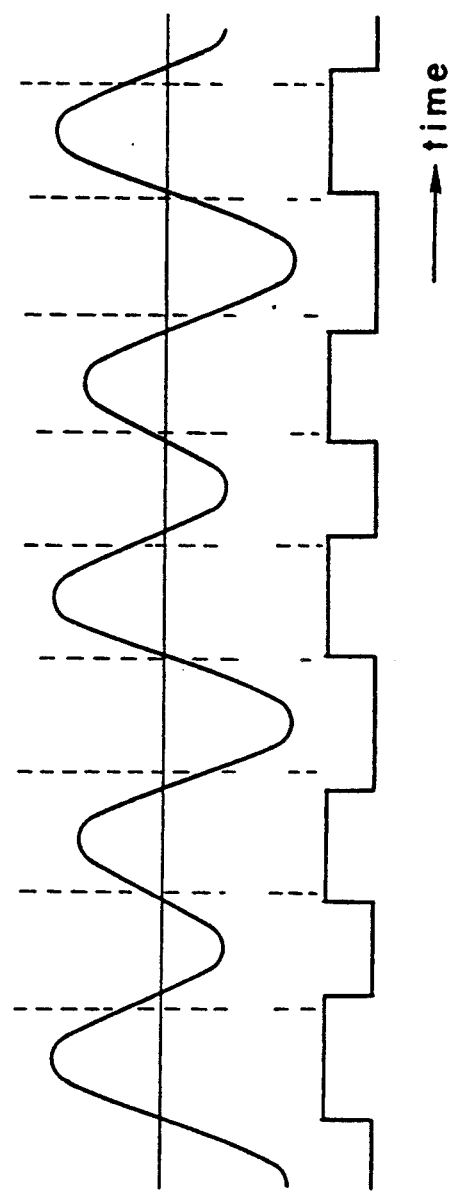
Fig. 5(b)
input waveform of clock fundamental wave into circuit of Fig. 5(a)
output waveform from the circuit of Fig. 5(a)
Fig. 5(c)
input waveform of 1/2 frequency division of clock fundamental wave into circuit of Fig. 5(a)
output waveform from circuit of Fig. 5(a)

5,245,593

CLOCK PRODUCING APPARATUS FOR A PWM SYSTEM DIGITAL TO ANALOG CONVERTER

BACKGROUND OF THE INVENTION

The present invention generally relates to a clock producing apparatus for a PWM (pulse width modulation) system D/A converter for improving the S/N (signal to noise ratio) in a PWM system D/A converter.

Generally, although the apparatuses using digital art have been put into practical use for a long time, a D/A converter is used in the converting of analog values into discrete values so as to effect digital processing, and converting them again into analog values. Although a resistance ladder has been used in D/A converting systems, the IC adaptation is being effected to reduce the cost. But the conversion accuracy of the D/A converter cannot be provided in terms of accuracy of the resistance values which may be made in the IC interior, thus resulting in higher costs of the IC for higher accuracy. Recently, the conversion accuracy has been retained by a IC adapted D/A converter using a PWM system without depen-dence upon the resistance value accuracy within the IC.

Recently, three types of sampling frequency apparatuses (CD, DAT, BS tuner) have been put into practical use. The clocks of a certain multiple of the input sampling frequency become necessary for use as the clocks of the PWM system. The clock frequency of the PWM system must be switched in accordance with the sampling frequency of the input signals to be D/A converted. As shown in the spectrum chart of FIG. 3, the spectra of the unnecessary components in the frequency division within the switching circuit appear in the clock of the switching circuit output at this time. Thus, the S/N in the D/A converter of the PWM system may be deteriorated.

The state of the deterioration will be described hereinafter by the following simulation. The explanation is provided by a reference document "Japan Acoustics Society Lecture Theses Collection, October 1988, P411 (1-6-13 Consideration on Clock Jitters in the PWM type D/A Converter) by KANAAKI Tetsuhiko: Matsushita Electric Industrial Co., Ltd., AV Research Laboratory."

The above described reference literature states: "The clock jitters increase the noise level, and the noise level is proportional to the jitter amount". Namely, as shown in FIG. 3, the 1/n frequency division (n is an integer) of the clock fundamental wave for the PWM system D/A converter leaks with respect to the clock fundamental wave for the PWM system D/A converter so as to generate the clock jitters. In FIG. 3, one half frequency division is (n=2).

FIGS. 4(a)–4(b) show the waveform charts of a time region. FIG. 4(a) is a waveform chart of the clock fundamental wave only for a PWM system D/A converter. FIG. 4(b) is a waveform chart where the one half frequency division output has been mixed with the fundamental waves, showing the frequency region of FIG. 3 converted into the time region.

When the output is put through such an amplifier as shown in FIGS. 5(a)–5(c) (the amplifier A shown in FIG. 5(a) is an amplifier of a type where the feedback operation has been effected at the input, output operations into the inverter in the logic circuit, with the threshold level existing), such waveforms as in FIG. 5(b) and 5(c) are provided. FIG. 5(b) is a waveform chart in the logic circuit when such a fundamental waveform in FIG. 4(a) has been inputted into FIG. 5(a). FIG. 5(c) is a waveform chart in the logic circuit when the fundamental wave with the one half frequen-cy division output of the FIG. 4(b) being mixed in it has been inputted into FIG. 5(a). Therefore, it is found out that the jitters have been caused in FIG. 5(c). Therefore, the noise due to the jitters are increased as shown in the above described reference literature.

Assume that the sampling frequency is fs when the input sampling frequency has been changed, and the clocks of the PWM shaped D/A converter are given in fs X l (the l is an integer, 128, 192, 384, 768 are generally used under the existing state). But if the fs is changed into fs1 and fs2, the clocks of the D/A converter for PWM use are necessary to be changed into the fs1 . l and the fs2 . l. At this time, a selector circuit of the fs1 . l and fs2 . l becomes necessary.

FIG. 6 is a block diagram for explaining it. In FIG. 6, reference numeral 20 is a fs1 X l oscillator, reference numeral 20 is a fs2 X l oscillator. The outputs thereof are inputted into the selector input terminals 22, 23 of the selector circuit 24, and the clock for the PWM system D/A converter to be outputted from the selector output terminal 25 is fed into the PWM system D/A converter 26. Also, the selector circuit 24 is switched by a switch-ing control signal to be inputted from the switching termi-nal 27 so as to select either of the selector input termi-nals 22 or 23.

FIG. 7 is a block diagram showing the details of the selector circuit 24. In FIG. 7, if the substrate voltage is slightly changed by the currents Ifs1 X l, Ifs2 X l run-ning through the substrate when the fs1 X l oscillator 20, the fs2 X l oscillator 21 have been selected in a case where the impedance of the substrate resistor R is high, the spectrum corresponding to the frequency of the current running through the substrate resistor turns round into the selector circuit 24 and is registrated on the spectrum of the clock. Also, the turning round from the power supply voltage within the IC is also effected.

The unnecessary spectrum is registrated upon the clock spectrum of the PWM system in this manner so as to cause the deterioration of the S/N (signal to noise ratio) in the D/A converter of the PWM system.

SUMMARY OF THE INVENTION

Accordingly, the present invention has been developed with a view to substantially eliminating the above discussed drawbacks inherent in the above description, and for its essential object to provide an improved clock oscillating apparatus for a PWM system D/A converter.

Another important object of the present invention is to provide an improved clock oscillating apparatus for a PWM system D/A converter which does not cause the above described unnecessary spectra.

In accomplishing these and other objects, accord-ing to one preferred embodiment of the present invention, there is provided a clock producing apparatus for a PWM system D/A converter of the present invention which includes: an oscillating circuit for oscillating at a clock frequency which is of an integer multiple of a minimum common multiple of a plurality of different input sampling frequencies, a frequency division circuit for dividing the clock frequency of the oscillating circuit so as to generate the outputs of the plurality of respectively different input sampling frequencies; a switch for selecting only inputs to the frequency division circuit corresponding to selected input sampling frequency so as to prevent the inputs to the frequency division circuit corresponding to the non-selected input sampling frequencies and a selecting circuit for selecting outputs corresponding to the elected input sampling frequencies.

Further, in the above described construction, the present invention is adapted to isolate the selecting circuit by an isolation layer from other circuits on a semiconductor device; wherein a substrate electrical potential, a power supply voltage and a ground are provided from an external portion of the semiconductor so as to isolate the selecting circuit from the other circuits; and wherein input signals, which go into the selecting circuit for selecting the above described frequency division outputs, are protected by a ground shielding wires to prevent leakage of respective input signals to each other.

In the above described construction, at the front stage where the clock for the PWM system D/A converter is selected, a switch for feeding the clock inputs to the frequency dividing circuit exists so as to correspond to two or more input sampling frequencies by using one oscillating circuit. The selecting operation is being effected by the selecting circuit so as to obtain the selected input sam-pling frequency, and at the same time, the clocks are prevented from being inputted to the frequency dividing circuit corresponding to the input sampling frequency which is not selected so as to prevent unnecessary spectra from being generated.

Also, even on the semiconductor device, the portion which has the common impedance with the other circuits is removed by the feeding of the substrate, the power supply voltage and the ground from the external portion of the semiconductor with the selecting circuit being isolated by the isolating layer from the other circuits. As there may have a possibility of coupling by the capacity of the wiring of the semiconductor device because of the higher frequency in the frequency division output, the ground shielding wires are inserted into the wirings of the above described frequency division outputs so as to prevent unnecessary spectra from being generated. Therefore, the spectral purity of the clocks for PWM system D/A converter may be increased, and unnecessary spectra are prevented so as to reduce the jitters of the clocks for the PWM system D/A converter.

BRIEF DESCRIPTION OF THE SEVERAL VIEWS

These and other objects and features of the present invention will become apparent from the following description taken in conjunction with the preferred embodi-ments thereof with reference to the accompanying drawings, in which;

FIG. 3 is a spectral chart of clocks in a case where clock jitters are caused;

Figure 6:
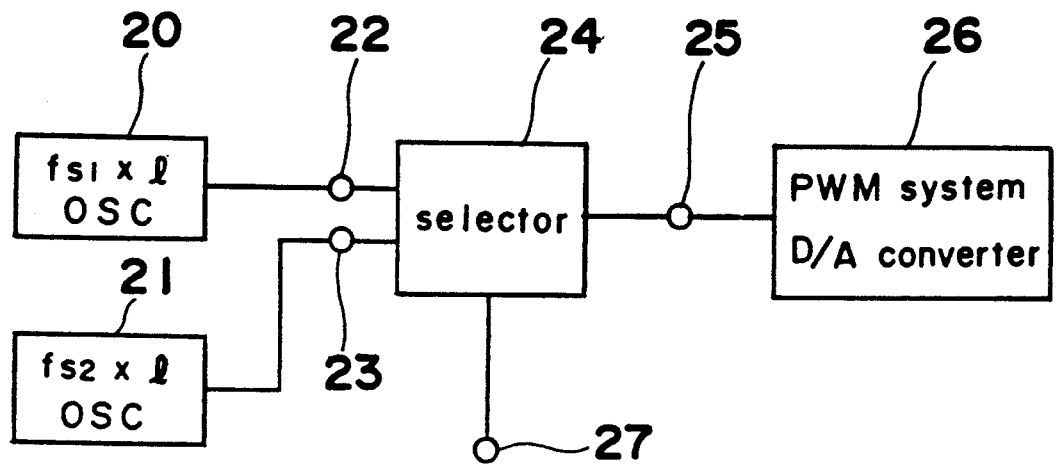
Figure 7:
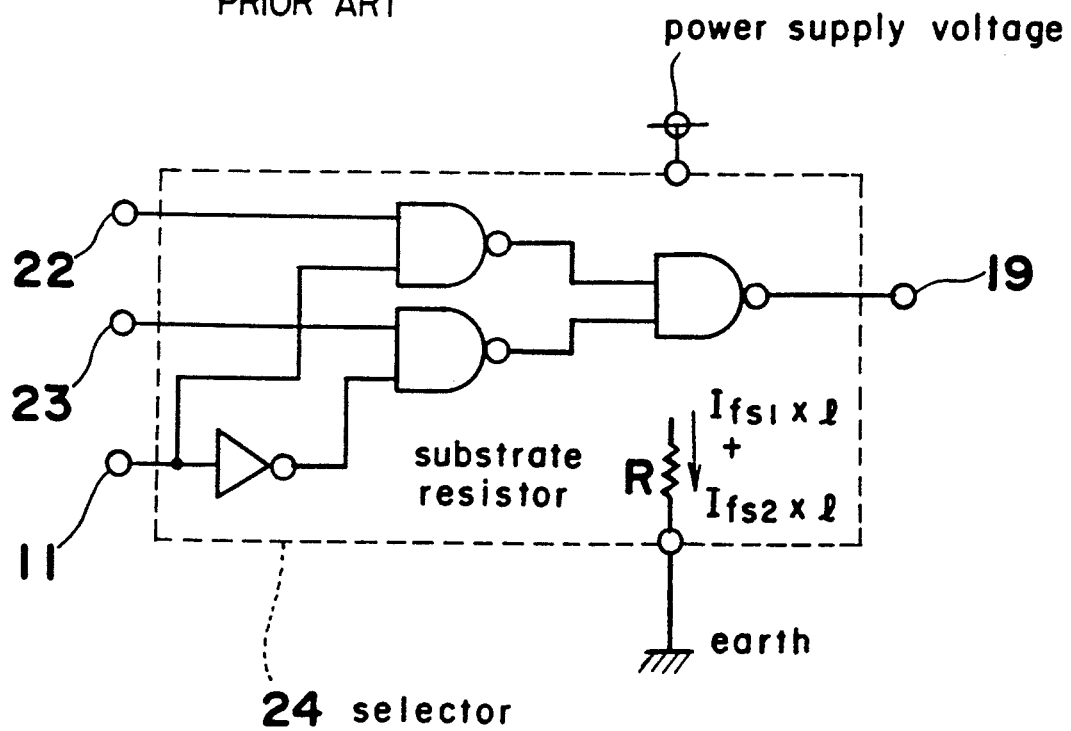

FIGS. 4(a) and 4(b) are a time region waveform chart of the clock fundamental waveform only and a time region wave chart with the divided frequency being mixed therewith;

FIG. 5(a) through 5(c) are a block diagram of an amplifier in a case where a gate has been constructed and is a waveform chart in a logic circuit when the waveform signals of the FIG. 4(a) and 4(b) have been inputted into the amplifier of FIG. 5(a);

FIG. 6 is a block diagram in a conventional embodiment in a case where clock jitters are caused; and FIG. 7 is a block diagram showing the details of the selection circuit of FIG. 6.

DETAILED DESCRIPTION OF THE PREFERRED EMBODIMENTS

Before the description of the present invention proceeds, it is to be noted that like parts are designated by like reference numerals throughout the accompanying drawings.

Figure 1:
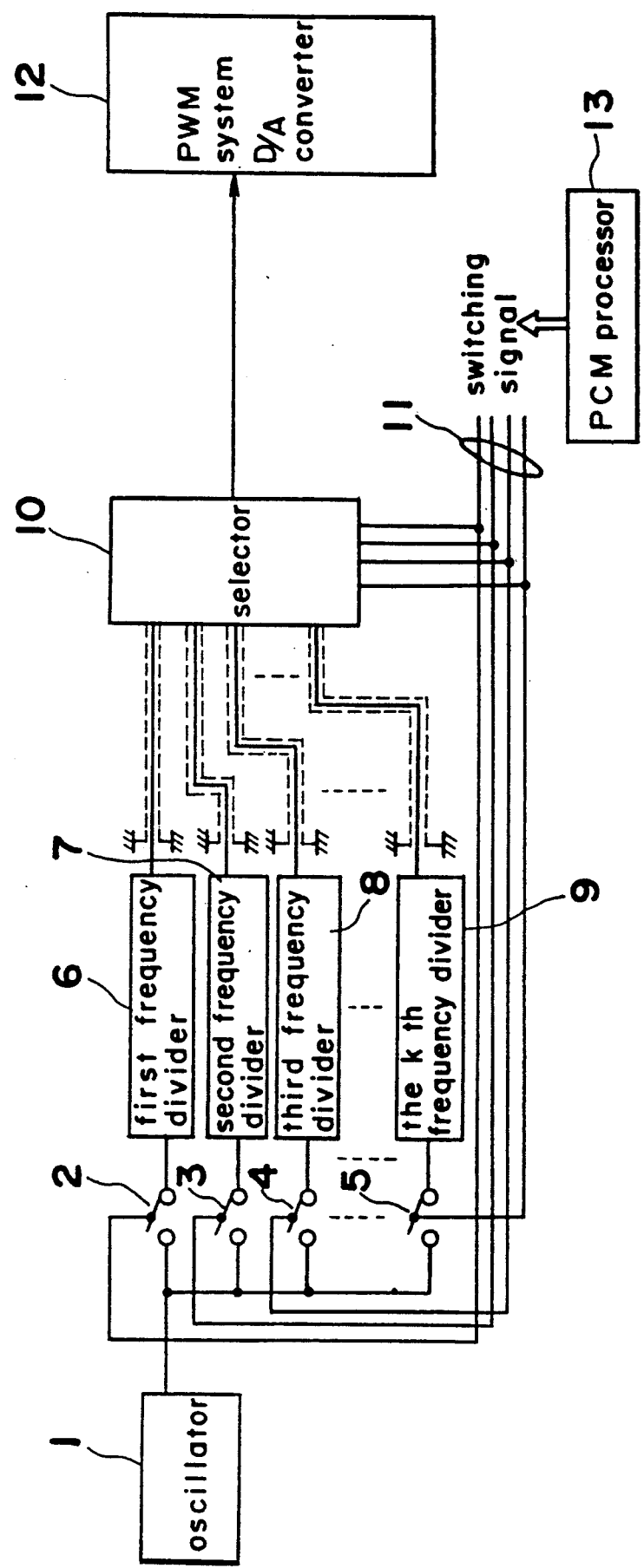
FIG. 1 is a block diagram of a clock producing apparatus for a PWM system digital analog converter in accordance with one embodiment of the present invention.

Referring now to the drawings, there is shown in FIG. 1, a block diagram of a clock producing apparatus for a PWM system D/A converter in accordance with one embodiment of the present invention, which includes an oscillator 1 that oscillates in a synchronous relationship with the input signals with an oscillation frequency of an integer multiple of the minimum common multiple of the different input sampling frequencies. A first switch, a second switch, a third switch, and a Kth switch are respectively disposed at reference numerals 2, 3, 4, 5 so as to switch the clock inputs of a first frequency divider 6, a second frequency divider 7, a third frequency divider 8, and a kth frequency divider 9. The outputs of the first through kth frequency dividers 6 through 9 are inputted into the selecting circuit 10, and are selected by the switching signal 11 obtained by the PCM processing circuit 13 and are inputted into the PWM system D/A converter 12. At this time, the selecting circuit 10 may be an OR gate if the outputs of the first through kth frequency dividers 6 through 9 are at a "Low" level.

Also, the frequencies of the first through kth frequency dividers 6 through 9 have the relationship of the first frequency divider frequency > the second frequency divider frequency > the third frequency divider frequency > the kth frequency divider frequency. One of the first through kth switches 2 through 5 is closed in accordance with the input sampling frequency, with only one of the first through kth frequency dividers 6 through 9 being operated by the clock inputs. Accordingly, unnecessary spectra caused by the other frequency dividers is removed.

Figure 2:
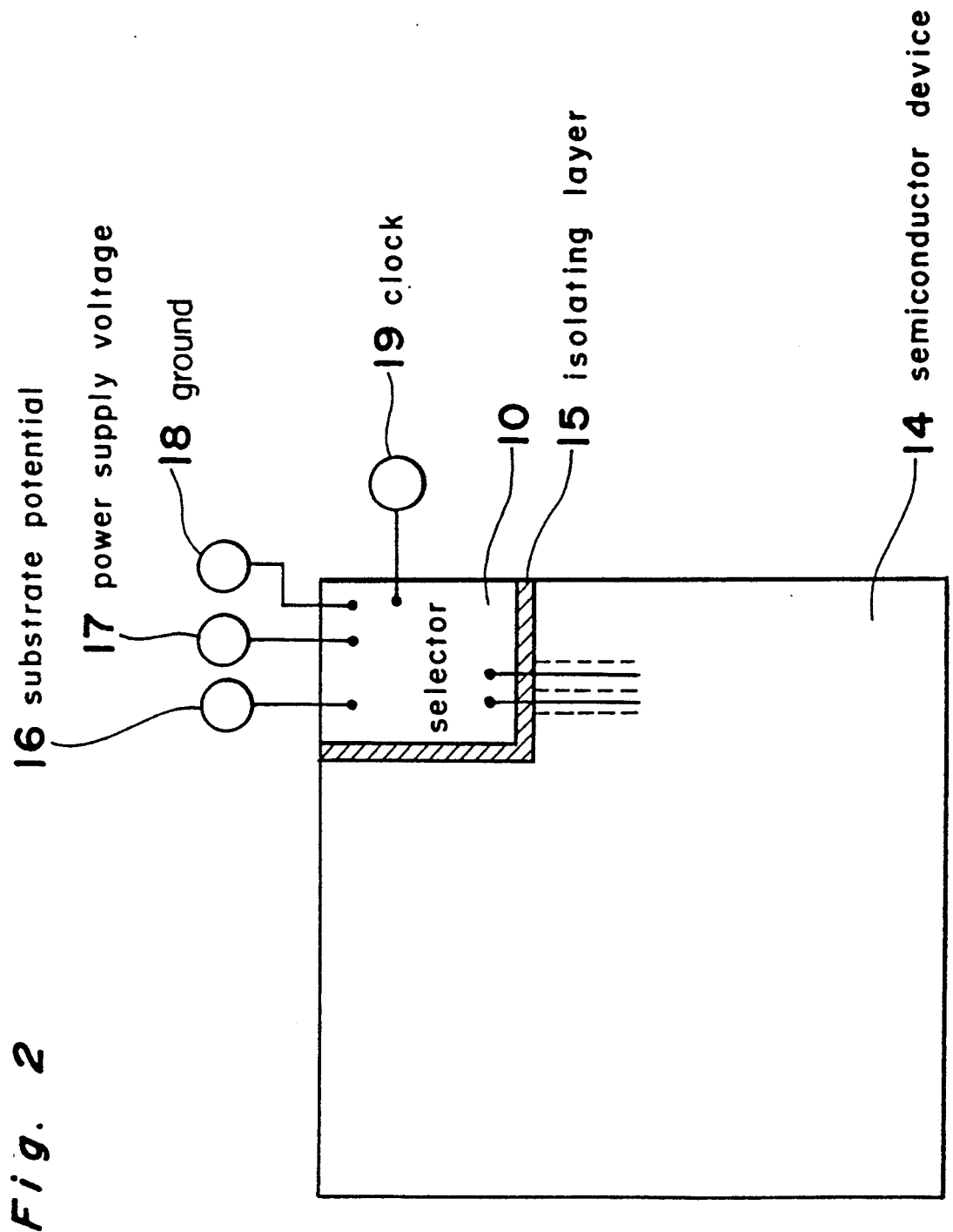
FIG. 2 is a model for realizing the selecting circuit of the clock producing apparatus on the semiconductor device.

FIG. 2 is a model where the selecting circuit 10 of FIG. 1 is realized on the semiconductor device. In FIG. 2, a semiconductor device 14 has the PCM processing circuit provided in it, a selecting circuit 10 is isolated from the other PCM processing circuits by the isolating layer 15, a substrate external portion electric potential 16, a power supply voltage 17, and a ground 18 are provided externally from the semiconductor device 14, along with a clock 19 for the PWM system D/A converter. As shown in FIG. 1, the shielding protection by the ground is effected at the location where the outputs of the first through the kth frequency dividers 6 through 9 are introduced into the selecting circuit 10.

In the above described construction, the portion which has the common impedance with the other circuit is removed by the feeding of the substrate external portion electrical potential 16, a power supply voltage 17, and ground 18 from the external portion so that the generation of unnecessary spectra are prevented. Also, the shield protection by the ground at the location of the introduction into the selecting circuit 10 is useful in the prevention of crosstalk (on the semiconductor device) with respect to the frequency division output.

As is clear from the foregoing description, according to the arrangement of the present invention, by the prevention of unnecessary spectrum from being caused even on the circuit and the actual semiconductor device so that the unnecessary spectra may not be caused in the spectra of the input clock into the PWM system D/A converter, the improvements in the S/N of the PWM system D/A converter are effected, the coping operation may be effected with respect to a plurality of input sampling frequencies, thus resulting in a reduced cost of the IC adaptation, with the practical effect thereof being large.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A clock producing apparatus for a PWM system digital to analog converter comprising: an oscillating circuit for oscillating at a clock frequency which is an integer multiple of a minimum common multiple of a plurality of different input sampling frequencies; a frequency division circuit for dividing said clock frequency of said oscillating circuit so as to produce outputs of said plurality of respectively different input sampling frequencies; a switch for selecting only inputs to said frequency division circuit corresponding to selected input sampling frequencies so as to prevent inputs to said frequency division circuit corresponding to non-selected input sampling frequencies; and a selecting circuit for selecting frequency division outputs corresponding to said selected input sampling frequencies.

2. A clock producing apparatus for a PWM system digital to analog converter in accordance with claim 1, where said selecting circuit is isolated by an isolation layer from other circuits on a semiconductor device, wherein a substrate electrical potential, a power supply voltage and a ground are provided from an external portion of said semiconductor device so as to isolate said selecting circuit from said other circuits; and wherein input signals to said selecting circuit are protected by a ground shielding wire, to prevent leakage of respective input signals to each other.

* * * * *